(12) United States Patent
He et al.

(10) Patent No.: US 6,953,752 B1
(45) Date of Patent: Oct. 11, 2005

(54) REDUCED SILICON GOUGING AND COMMON SOURCE LINE RESISTANCE IN SEMICONDUCTOR DEVICES

(75) Inventors: Yue-Song He, San Jose, CA (US); Sameer Haddad, San Jose, CA (US); Zhi-Gang Wang, San Jose, CA (US); Richard Fastow, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 305 days.

(21) Appl. No.: 10/358,756

(22) Filed: Feb. 5, 2003

(51) Int. Cl.[7] .......................................... H01L 21/311
(52) U.S. Cl. ....................................... 438/700; 438/723
(58) Field of Search ............................... 438/700, 704, 438/706, 710, 712, 713, 719, 723, 253, 396

(56) References Cited

U.S. PATENT DOCUMENTS

| | | | | |
|---|---|---|---|---|
| 4,956,311 A | * | 9/1990 | Liou et al. | 438/231 |
| 5,792,687 A | * | 8/1998 | Jeng et al. | 438/253 |
| 6,074,955 A | * | 6/2000 | Lin et al. | 438/710 |
| 6,136,646 A | * | 10/2000 | Linliu et al. | 438/255 |
| 6,165,879 A | * | 12/2000 | Lee et al. | 438/586 |
| 6,261,907 B1 | * | 7/2001 | Chang | 438/266 |
| 6,383,921 B1 | * | 5/2002 | Chan et al. | 438/649 |
| 6,479,859 B2 | * | 11/2002 | Hsieh et al. | 257/315 |
| 6,570,214 B1 | * | 5/2003 | Wu | 257/315 |

* cited by examiner

*Primary Examiner*—Kin-Chan Chen

(57) ABSTRACT

In the present method of undertaking a self aligned source etch of a semiconductor structure, a substrate has oxide thereon. First and second adjacent stacked gate structures are provided on the substrate. Oxide spacers are provided on the respective first and second adjacent sides of the first and second gate stacked structures, and polysilicon spacers are provided on the respective oxide spacers. A self aligned source etch is undertaken using the gate structures, oxide spacers, and polysilicon spacers as a mask. The polysilicon spacers are then removed, and metal, for example cobalt, is provided on the substrate, using the oxide spacers as a mask. A silicidation step is undertaken to form metal silicide common source line on the substrate.

9 Claims, 7 Drawing Sheets

# REDUCED SILICON GOUGING AND COMMON SOURCE LINE RESISTANCE IN SEMICONDUCTOR DEVICES

BACKGROUND OF THE INVENTION

1. Technical Field

This invention relates generally to semiconductor devices, and more particularly, to semiconductor devices wherein a self-aligned source (SAS) etch is undertaken and a common source line is formed in a memory array.

2. Background Art

Reference is made to FIGS. 1–5, which illustrate a typical version of particular steps in undertaking a self aligned source (SAS) etch. As shown in FIG. 1, a silicon substrate 20 has thereon adjacent gate stacks 22, 24 formed by well-known processing steps. Each gate stack includes a tunnel oxide 26, a polysilicon floating gate 28, a dielectric, for example ONO layer 30, and a polysilicon word line 32, all as is well-known. Next, an oxide layer 34 is formed on the resulting structure, as shown in FIGS. 2 and 3, covering oxide isolation regions 36 in trenches 38 formed in the substrate 20, the gate stacks 22, 24, and the silicon substrate 20 between the gate stacks 22, 24. After formation of a patterned photoresist mask 40, an anisotropic etch of the exposed oxide is undertaken to form spacers 42, 44 on the adjacent sides of the gate stacks 22, 24, in preparation for undertaking a self aligned source etch. A purpose of the spacers 42, 44 is to protect the silicon underneath the tunnel oxide (FIG. 4) from being gouged during the self aligned source etch, which, without such spacers 42, 44, can result in severely degrading the erase integrity and erase distribution of the device.

As will be seen, the self aligned source etch must be undertaken for a substantial time in order to completely etch through the thick oxide isolation regions 36 (FIG. 5) in preparation for providing a common source line to connect the sources of the device. It has been found that, during such substantial self aligned source etching step, some of the oxide spacer 22, 24 material is laterally etched away during this process, allowing the etchant closer to the silicon substrate 20 adjacent the tunnel oxide 26 than is desirable. This reduces the effectiveness of the spacers 42, 44 in preventing the gouging of the silicon substrate 20 as described above.

Another problem arises with regard to the formation of a common source line once the self-aligned source etch has been undertaken. Typically, an ion implantation step is undertaken to form the common source line, the width of the line being determined by the spacing between the spacers. As is well known, it is desirable to scale, i.e., decrease the dimensions of conventional memory cells in order to increase their density in the memory array. In doing so, the formed source line becomes narrower, so that without adjustments in the process, common source line resistance increases.

Therefore, what is needed is a method for reducing gouging of the silicon substrate near the tunnel oxide of a flash memory device by ensuring the integrity of spacers on the sidewalls of the stacked gates during the self aligned source etch. What is further needed is a process for forming a common source line of very low resistance so that device scaling is promoted.

DISCLOSURE OF THE INVENTION

In the present method of undertaking a self aligned source etch of a semiconductor structure, a substrate has oxide provided thereon. First and second adjacent stacked gate structures are provided on the substrate. First and second oxide spacers are provided on the respective first and second adjacent sides of the first and second gate stacked structures. First and second polysilicon spacers are provided on the first and second oxide spacers respectively. The oxide on the substrate is etched using the first and second gate structures, first and second oxide spacers, and first and second polysilicon spacers as a mask. The polysilicon spacers are then removed, and metal is provided on the substrate, using the oxide spacers as a mask. A silicidation step is undertaken to form metal silicide on the substrate.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

BEST MODE(S) FOR CARRYING OUT THE INVENTION

Reference is now made in detail to a specific embodiment of the present invention which illustrates the best mode presently contemplated by the inventors for practicing the invention.

Figure 1:
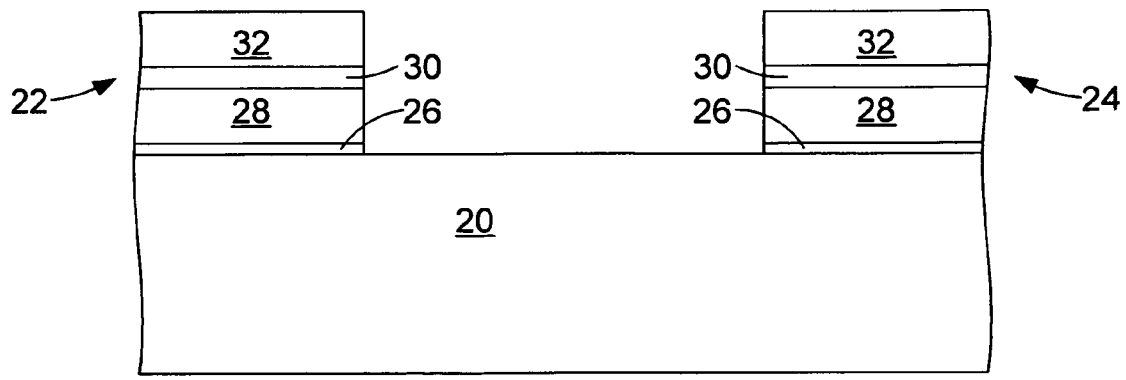
FIG. 1 illustrates a process step in a typical prior art process.
Figure 2:
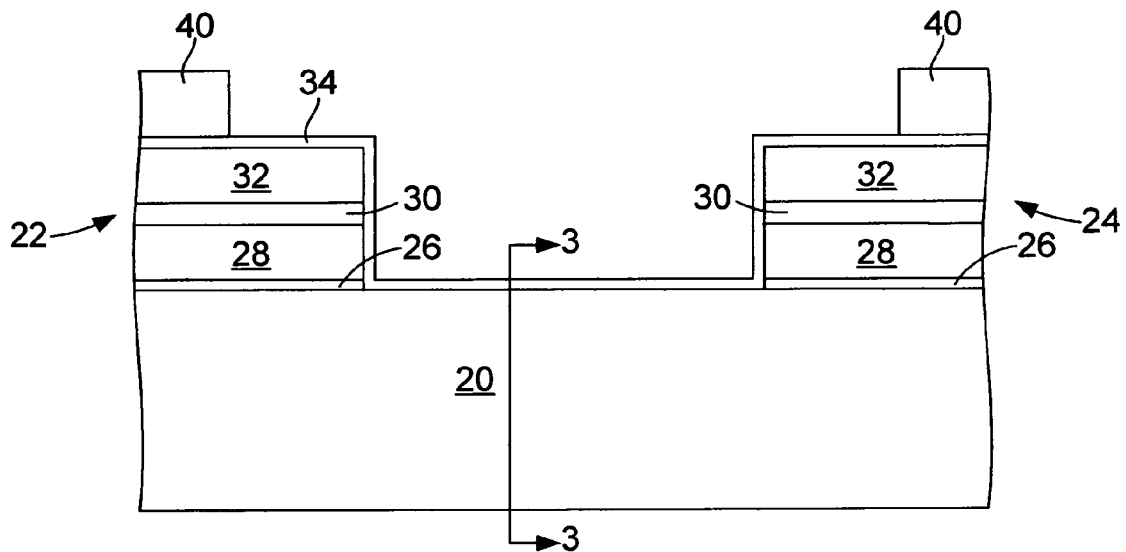
FIG. 2 illustrates a further step in a typical prior art process.
Figure 3:
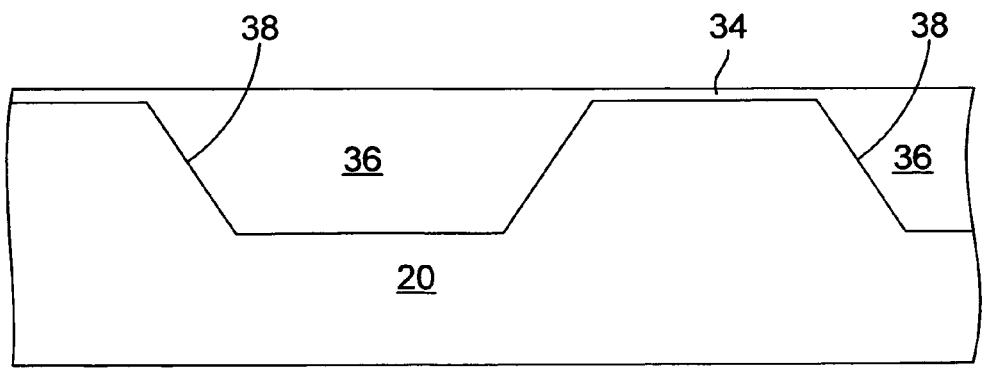
FIG. 3 is a sectional view taken along the line 3—3 of FIG. 2.
Figure 4:
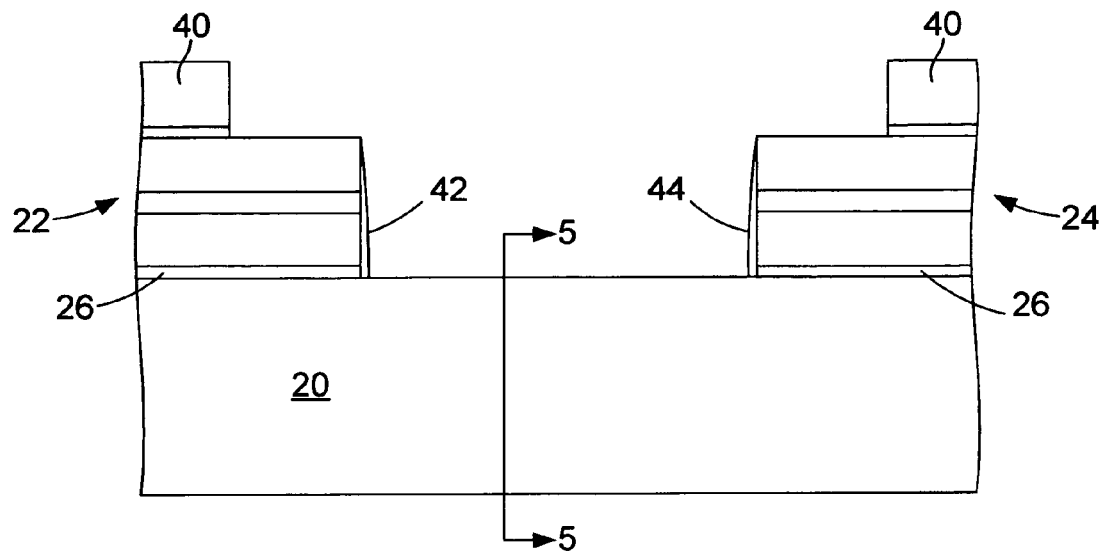
FIG. 4 illustrates a further process step in a typical prior art process.
Figure 5:
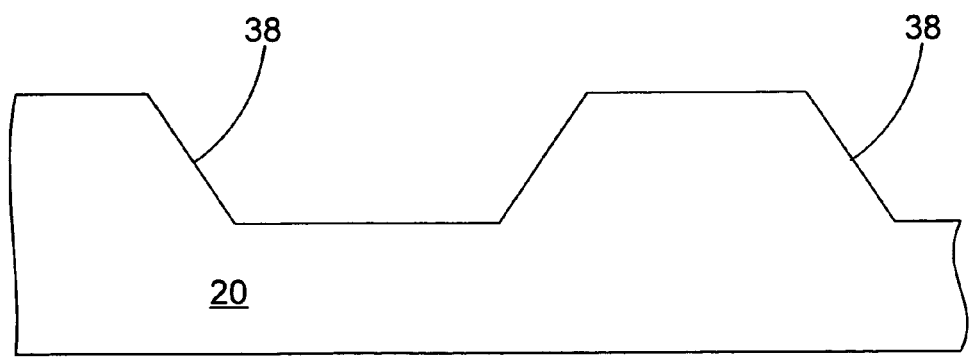
FIG. 5 is a sectional view taken along the line 5—5 of FIG. 4.
Figure 6:
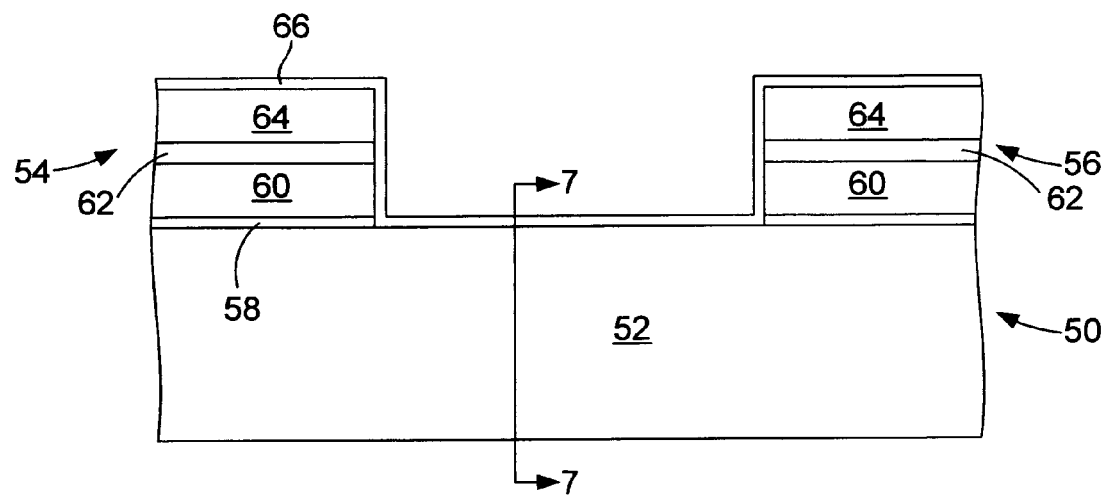
FIG. 6 illustrates a process step in accordance with the present invention.
Figure 7:
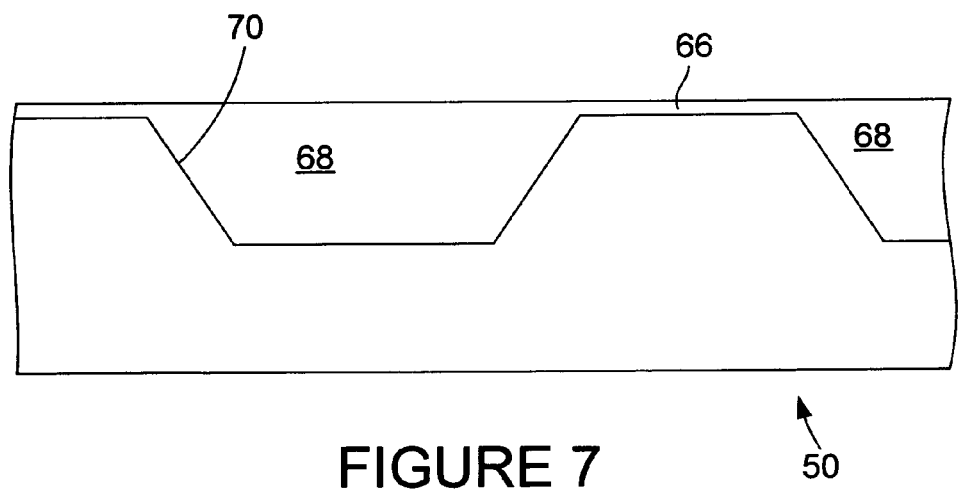
FIG. 7 is a sectional view taken along the line 7—7 FIG. 6.
Figure 8:
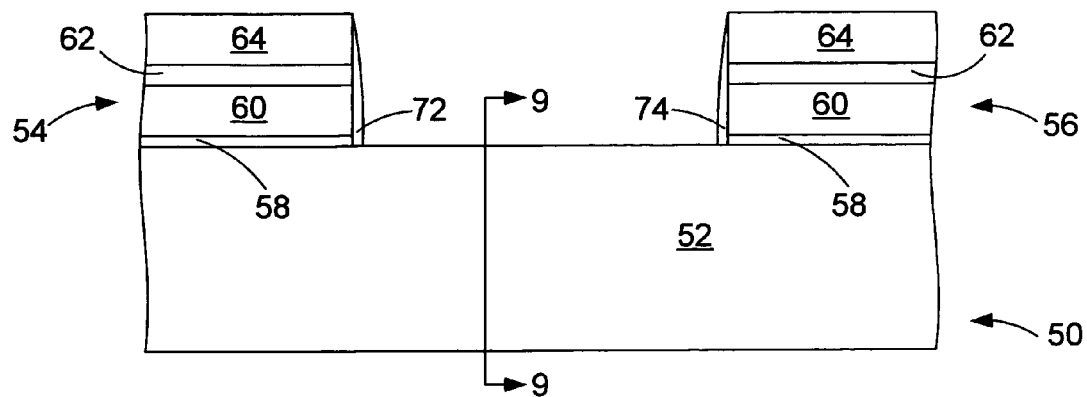
FIG. 8 illustrates a further process step in accordance with the present invention.
Figure 9:
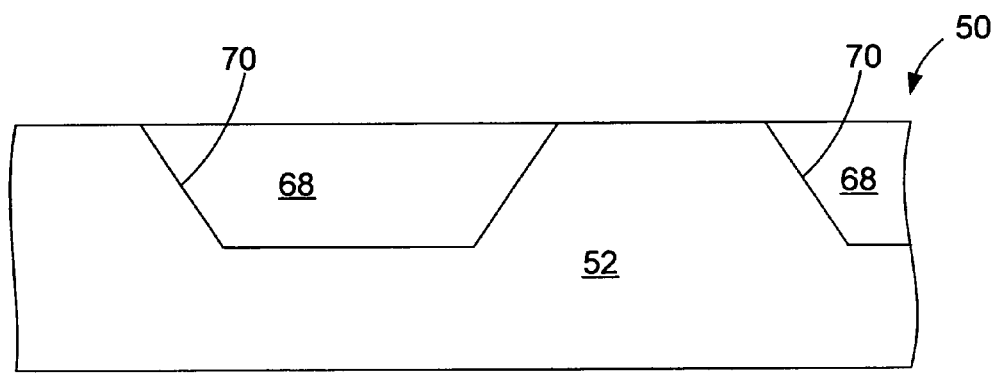
FIG. 9 is a sectional view taken along the line 9—9 FIG. 8.
Figure 10:
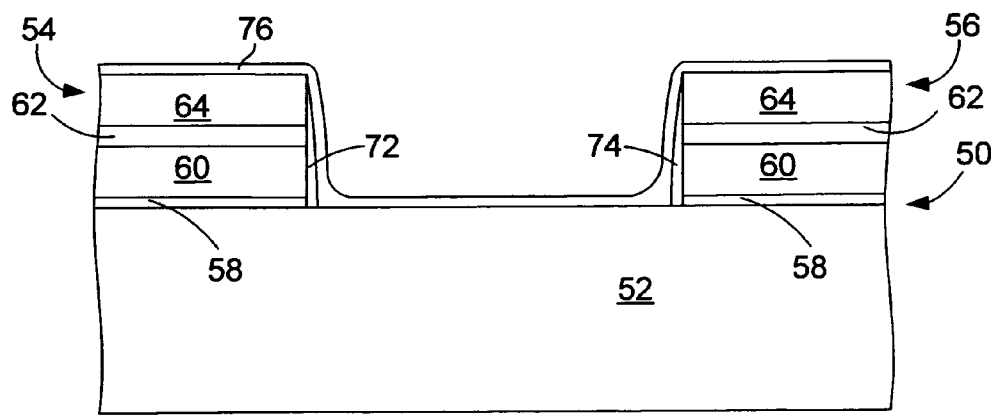
FIGS. 10–12 illustrate further process steps in accordance with the present invention.
Figure 11:
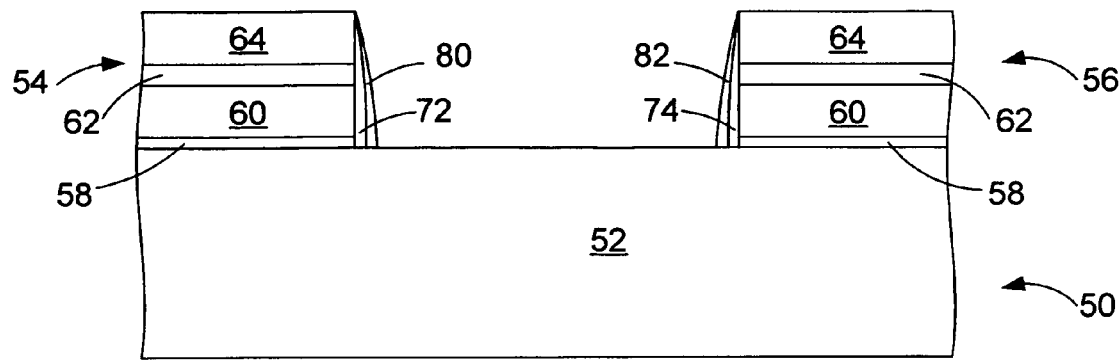

FIG. 6 shows the present structure 50 in a state similar to that shown in FIG. 2. As shown in FIG. 6, a silicon substrate 52 has adjacent gate stacks 54, 56 thereon formed by well-known processing steps. Each gate stack includes a tunnel oxide 58 on the substrate 52, a polysilicon floating gate 60 on the tunnel oxide 58, a dielectric, for example, ONO layer 62 on the floating gate 60, and a polysilicon word line 64 on the dielectric layer 62, all as is well-known. A dielectric layer, for example, an oxide layer 66 is formed on the resulting structure as shown in FIGS. 6 and 7, over oxide isolation regions 68 in trenches 70 formed in the substrate 52, the gate stacks 54, 56, and the silicon substrate 52 between the gate stacks 54, 56. An anisotropic etch of the exposed oxide is undertaken to form spacers 72, 74 on the adjacent sides of the gate stacks 54, 56 respectively. This etch is undertaken for a period of time sufficient to form the oxide spacers 72, 74 on the respective adjacent sides of the gate stacks 54, 56 respectively but leaving the thick oxide isolation regions 68 substantially intact (FIGS. 8 and 9). Then, instead of undertaking a self aligned source etch as in the prior art, a polysilicon layer 76 is deposited on the resulting structure, covering the polysilicon word lines 64, the oxide spacers 72, 74, and the exposed portion of the substrate 52 between the spacers 72, 74 (FIG. 10). The polysilicon layer 76 is then anisotropically etched to form polysilicon spacers 80, 82 (FIG. 11) on and covering the oxide spacers 72, 74 so that such polysilicon spacers 80, 82 are adjacent and associated with the respective adjacent sides of the gate stacks 54, 56 respectively.

Figure 12:
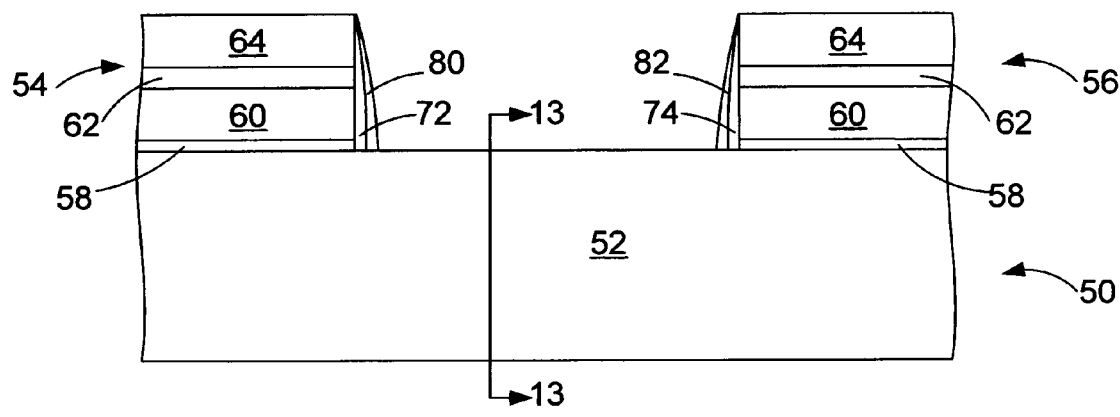
Figure 13:
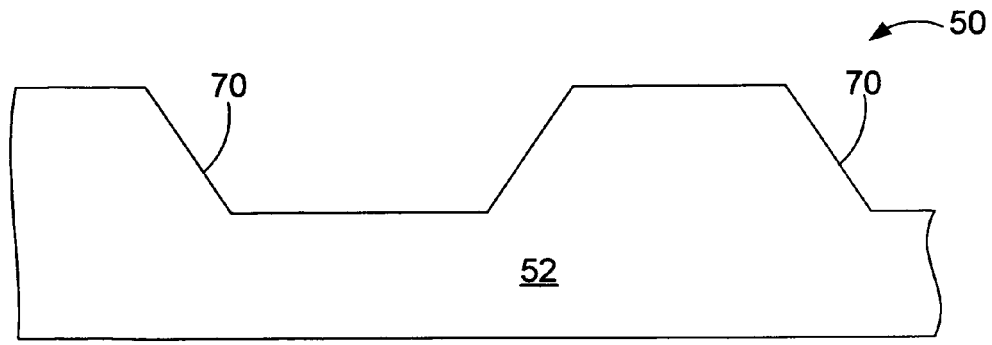
FIG. 13 is a sectional view taken along the line 13—13 FIG. 12.

Then, a self aligned source etch is undertaken to etch the exposed oxide on the substrate 52, using the stacked gates 54, 56, oxide spacers 72, 74, and polysilicon spacers 80, 82 as a mask, etching through the oxide isolation regions 68 between the polysilicon spacers 80, 82 (FIGS. 12 and 13).

The etching process used for the self aligned source etch is highly selective to oxide over polysilicon, for example, in the range of 20:1 to 100:1 in the rate of etching of oxide as compared to polysilicon. Thus, very little lateral etching of the polysilicon spacers 80, 82 takes place even when etching through the thick field oxide regions 68. This means that the silicon underneath the tunnel oxide 58 is well protected from gouging during the self aligned source etch as compared to the prior art described above. Thus, improve integrity and performance of the tunnel oxide in the operation of the device is achieved.

Figure 14:
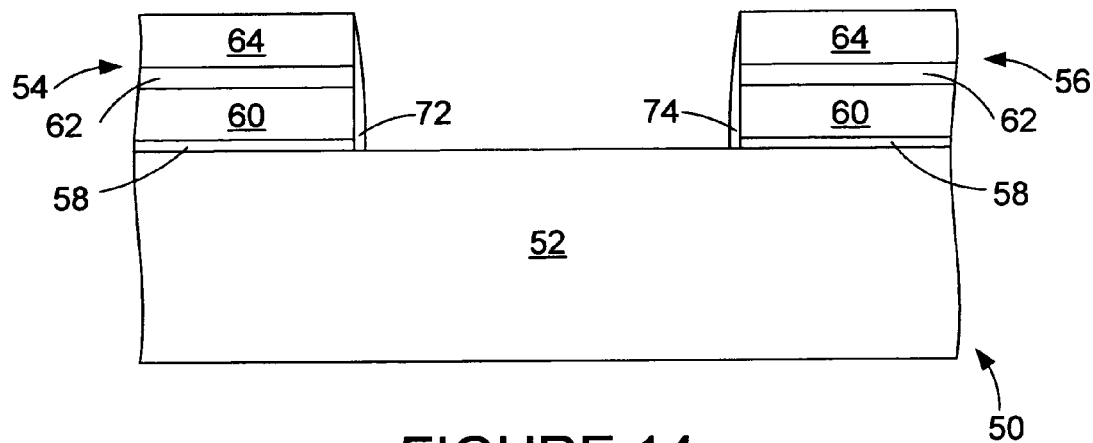
FIGS. 14–16 illustrate further process steps in accordance with the present invention.
Figure 15:
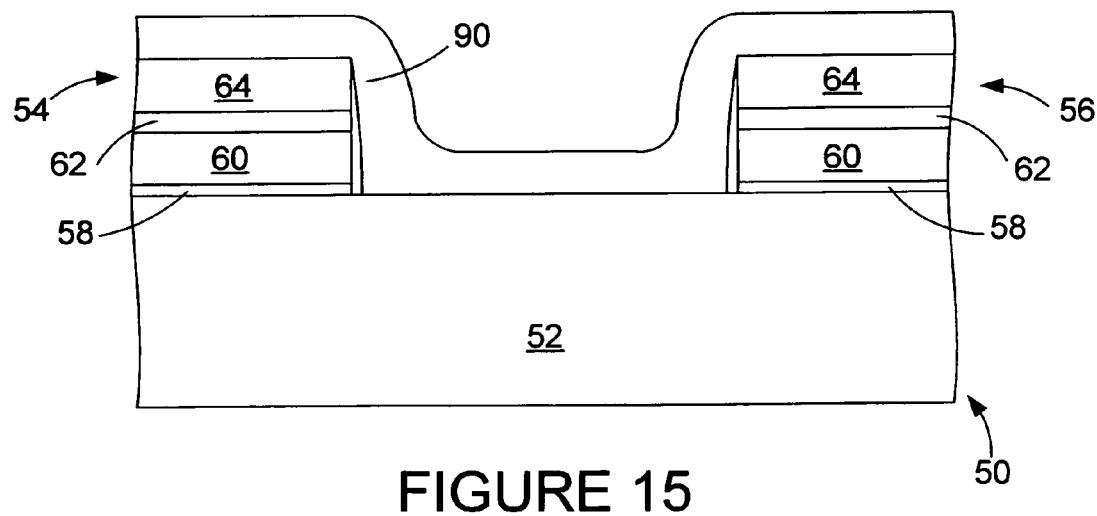
Figure 16:
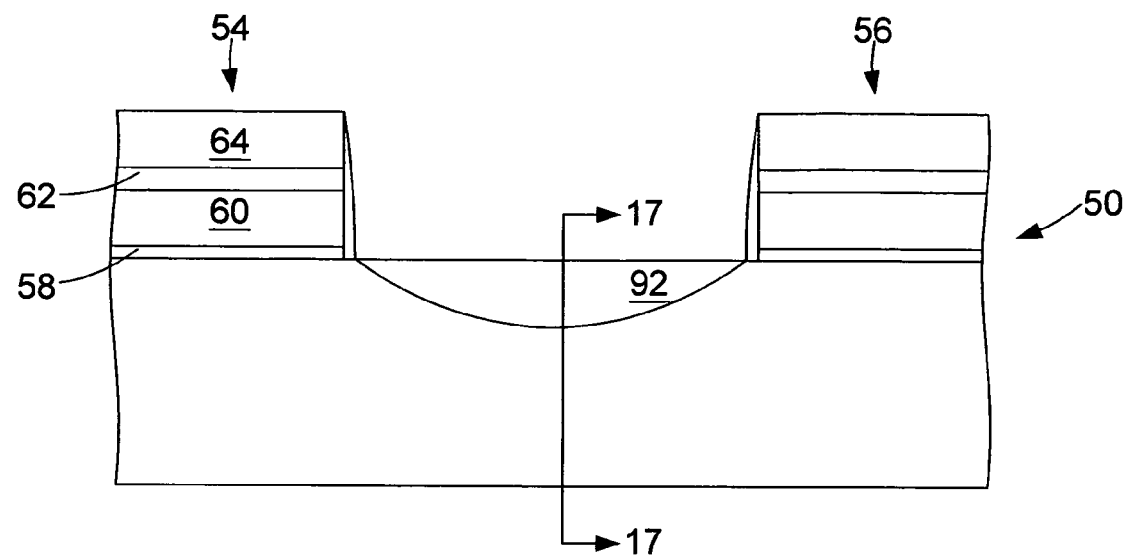
Figure 17:
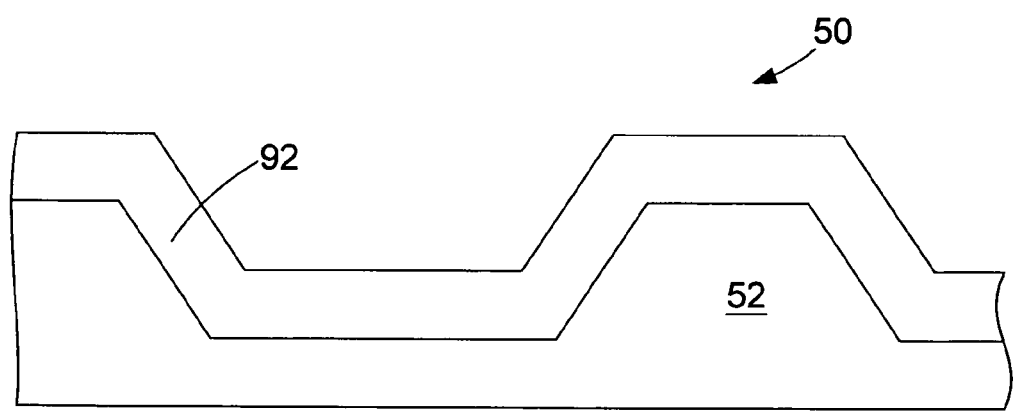
FIG. 17 is a sectional view taken along the line 17—17 of FIG. 16.

Then, polysilicon spacers 80, 82 and the remainder of polysilicon layer on the word lines 64 are removed, resulting in the structure shown in FIG. 14. Next, a layer of metal 90 such as cobalt is deposited over the resulting structure, on the polysilicon word lines 64, the oxide spacers 72, 74, and the portion of the silicon substrate 52 between the spacers 72, 74. A silicidation step is then undertaken, the cobalt 90 reacting with the polysilicon of the word lines 64 and the silicon of the substrate 52 to form cobalt silicide 94 in those regions, but not of course reacting with the oxide spacers 72, 74. The unreacted cobalt is then removed, resulting in the structure shown in FIG. 16. As will be seen, a common source line 92 of cobalt silicide has been formed, running continuously along the top of the silicon substrate 52 so as to connect source regions of the device.

The cobalt silicide common source line 92 has greatly reduced resistance as compared to a common source line of similar cross-section formed by conventional means. Thus, such a common source line lends itself readily to reduction of device size, avoiding the problem of excessive resistance thereof due to scaling.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of undertaking a self aligned source etch in a semiconductor structure comprising:
   providing a substrate having oxide thereon;
   providing first and second adjacent stacked gate structures on the substrate;
   providing first and second polysilicon spacers associated with first and second adjacent sides of the first and second stacked gate structures respectively; and
   etching the oxide on the substrate, using the first and second gate structures and first and second polysilicon spacers as a mask.

2. The method of claim 1 and further comprising the step of providing first and second dielectric spacers on the respective first and second adjacent sides of the first and second gate structures, the first and second polysilicon spacers being provided on the first and second dielectric spacers respectively.

3. The method of claim 2 wherein the dielectric spacers are oxide spacers.

4. The method of claim 3 and further comprising a method of forming a common source line on the substrate comprising, subsequent to said oxide etch, removing the polysilicon spacers, and, using the oxide spacers as a mask, providing metal on the substrate and undertaking a silicidation step to form metal silicide on the substrate.

5. The method of claim 4 and further comprising providing a metal on the substrate and on the oxide spacers, and undertaking a silicidation step to form metal silicide on the substrate.

6. The method of claim 5 and further comprising removing unreacted metal from the oxide spacers subsequent to undertaking the silicidation step to form metal silicide on the substrate.

7. A method of undertaking a self aligned source etch and forming a common source line in a semiconductor structure comprising:
   providing a substrate having oxide thereon;
   providing first and second adjacent stacked gate structures on the substrate;
   providing first and second dielectric spacers on the respective first and second adjacent sides of the first and second stacked gate structures;
   providing first and second polysilicon spacers on the first and second dielectric spacers respectively;

etching the oxide on the substrate using the first and second gate structures, first and second dielectric spacers, and first and second polysilicon spacers as a mask;
removing the polysilicon spacers;
providing metal on the substrate, using the dielectric spacers as mask, and on the dielectric spacers; and
undertaking a silicidation step to form metal silicide on the substrate.

8. The method of claim 7 and further comprising removing unreacted metal from the dielectric spacers subsequent to undertaking the silicidation step to form metal silicide on the substrate.

9. The method of claim 8 wherein the dielectric spacers are oxide spacers.

* * * * *